United States Patent [19]

Schulze

[11] Patent Number: 4,716,373

[45] Date of Patent: Dec. 29, 1987

[54] METHOD AND CIRCUIT ARRANGEMENT FOR INCREASING THE SIGNAL-TO-NOISE RATIO OF A PERIODICAL ELECTRICAL SIGNAL

[75] Inventor: Michael Schulze, Much, Fed. Rep. of Germany

[73] Assignee: U.S. Philips Corporation, New York, N.Y.

[21] Appl. No.: 665,836

[22] Filed: Oct. 29, 1984

[30] Foreign Application Priority Data

Oct. 28, 1983 [DE] Fed. Rep. of Germany ....... 3339146

[51] Int. Cl.$^4$ ............................................. H04B 1/10
[52] U.S. Cl. ................................. 328/165; 328/127; 328/162
[58] Field of Search ............... 328/147, 146, 127, 162, 328/164, 165, 167; 364/724, 733, 825, 829; 307/520, 529; 455/303, 304

[56] References Cited

U.S. PATENT DOCUMENTS

| | | | |
|---|---|---|---|
| 3,716,780 | 2/1973 | Van Elk et al. | 328/127 |
| 4,311,963 | 1/1982 | Watanabe et al. | 328/165 |
| 4,314,377 | 2/1982 | Kondo et al. | 328/165 |

FOREIGN PATENT DOCUMENTS 3125140  1/1983  Fed. Rep. of Germany .

*Primary Examiner*—Stanley D. Miller
*Assistant Examiner*—Timothy P. Callahan
*Attorney, Agent, or Firm*—Thomas A. Briody; Jack Oisher; William J. Streeter

[57] ABSTRACT

The invention relates to a method of increasing the signal-to-noise ratio of a periodical electrical signal. In general, noise suppression of a periodical signal may be obtained by means of averaging a number of successive signals. In one embodiment of the present invention, the amplitudes of successive periodical signals are integrated for successive time periods which exclude various signal suppression subperiods. The suppression subperiods may be of variable duration, and are positioned beside each other in consecutive fashion. An overall integration value is also formed, by processing the amplitude of the signal without suppressing any portion thereof. From this overall integration value, the integration values associated with the various suppression subperiods are subtracted. The resulting difference signals are arranged in the same sequence as their associated suppression subperiods so as to produce an output signal having the same general waveform as the periodical signal. In an alternative embodiment, instead of integration values, corresponding average values of the signal amplitude may be used.

18 Claims, 5 Drawing Figures

METHOD AND CIRCUIT ARRANGEMENT FOR INCREASING THE SIGNAL-TO-NOISE RATIO OF A PERIODICAL ELECTRICAL SIGNAL

BACKGROUND OF THE INVENTION

The invention relates to a method of increasing the signal-to-noise ratio of a periodical electrical signal and to a circuit arrangement for carrying out this method.

Several methods of increasing the signal-to-noise ratio are generally known already. For example, in one method for processing back-scattering signals in light wave guides, successive back-scattering signals are recorded by a rapid digital transient recorder. Then, by means of a digital computer, average values are formed from the successive back-scattering signals for the same portions of each successive signal. This digital processing permits a very effective noise suppression. However, to obtain an improvement of the signal-to-noise ratio by a factor M requires $M^2$ back-scattering signals for averaging. Other disadvantages of this method reside in the high cost for the rapid digital transient recorder and in the relatively complicated digital processing required.

German published patent application No. 31 25 140 discloses an analogue method of improving the signal-to-noise ratio of a back-scattering signal in lightwave guides. In the method disclosed therein, the back-scattering signals are successively added to the previously stored signal by using an analogue storage chain. Each stored back-scattering signal or, alternatively, the variation of its curve, is read out with an appropriate time delay so that the stored signal is pointwise added at the correct instant to a successive back-scattering signal, and the resulting signal is written back into the analogue storage chain. In this kind of averaging, a desired improvement of the signal-to-noise ratio by the factor M also requires $M^2$ back-scattering signals.

SUMMARY OF THE INVENTION

The invention has for its object to provide a method and a circuit arrangement for increasing the signal-to-noise ratio of a periodical electrical signal, by which method and circuit an effective noise reduction can be attained with a considerably smaller number of repetitions of the signal than the $M^2$ number required by the prior art, in order to improve the signal-to-noise ratio by a factor M.

According to the invention, this object is achieved by processing the amplitude of successive signals whilst suppressing the signal during associated signal suppression subperiods. In one embodiment, the processing comprises integrating the signal amplitude during the time when the signal is not being suppressed, with the resulting integration value obtained using each suppression subperiod being associated with that subperiod. The signal suppression subperiods are chosen so that they fall within the portion of the periodic signal for which the signal-to-noise ratio is to be improved, with the subperiods being positioned beside each other in consecutive fashion. The periodic signal amplitude is also processed without suppressing any portion thereof, in order to provide an overall integration value. From this overall value, the integration values associated with the various suppression subperiods are subtracted. The resulting difference signals are arranged in the same sequence as their associated suppression subperiods, so as to form an output signal having the same general waveform as the original periodic signal, but with an improved signal-to-noise ratio. The output signal with reduced noise is thus formed from a sequence of difference values associated with the corresponding signal suppression subperiods. These difference values may be formed by subtracting the integration values associated with the suppression subperiods from the overall integration value either immediately upon determination of the appropriate values, or after intermediate storage in either analogue storage chains or digital storages (after analogue-to-digital conversion). In an alternative embodiment, instead of using integration values associated with the periodic signal amplitude, average values thereof may be determined.

According to an advantageous further embodiment of the invention, the signal suppression subperiods are variable in duration so that the periodical signal can be processed using variable resolution. Another advantage of the invention is that the signal suppression subperiods may be formed so that only that portion of the periodic signal which is of interest is processed. Thus, it becomes possible to present only given portions of a signal, with those portions having reduced noise.

An advantageous circuit arrangement for carrying out the invention comprises an electrically controllable analogue switch, to whose input is applied the periodical signal and whose output is connected to integration means for forming the overall integration value and the integration values associated with the suppression subperiods. The integration means is connected to subtraction means for forming the difference values between the overall integration value and the subperiod-associated integration values. The analogue switch is electrically connected to a control device, which device controls the switch so as to provide the appropriate signal suppression subperiods and signal transmission periods. Alternatively, the control device and the subtraction means may be replaced by a microprocessor, with an analogue-to-digital converter being electrically connected between the microprocessor and the integration means. The microprocessor may also be electrically connected at its output to a digital-to-analogue converter.

BRIEF DESCRIPTION OF THE FIGURES

In order that the invention may be readily carried out, it will now be described more fully with reference to the accompanying drawing, in which.

DETAILED DESCRIPTION OF THE PREFERRED EMBODIMENT

Figure 1:
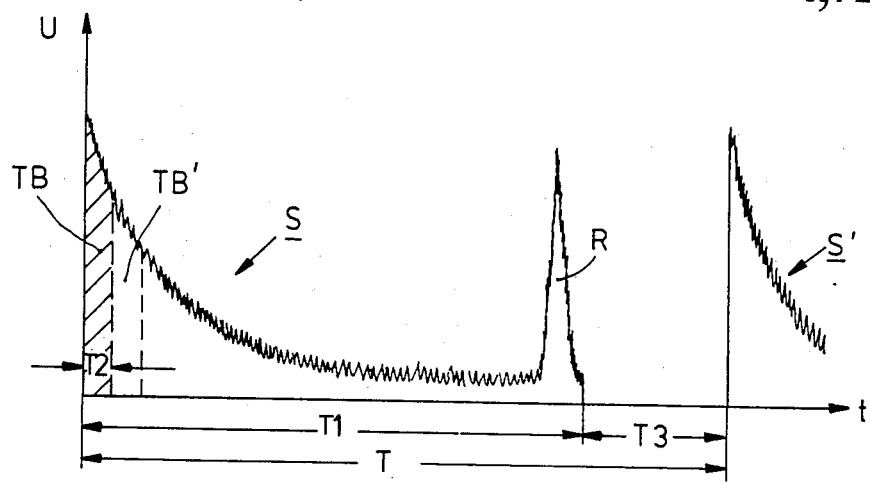
FIG. 1 shows a variation of signal amplitude versus time for a typical back-scattering signal of a light wave guide.

FIG. 1 represents a noisy periodical electrical signal S, which is, for example, the back-scattering signal of a light wave guide. Typically, such a signal is obtained by periodical coupling of radiation into the light wave guide and by measurement of the radiation coupled out of the light wave guide at the coupling-in location. In the example shown, the signal component R represents the radiation reflected at the end surface of the light wave guide. The back-scattering signal S, which has the period T, is to be processed so as to improve the signal-to-noise ratio of the portion of signal S falling within a desired base time period T1. In accordance with the present invention, the signal S is processed by, for example, integration of the signal amplitude during period T1, to provide an overall integration value, with signal S being suppressed over the time interval T3. Base time period T1 is divided into a number of successive suppression subperiods T2, T2', etc., during which successive subperiods the signal amplitude is suppressed for succeeding repetitions of the periodic signal and, therefore, not processed during those subperiods. The suppression subperiods are arranged so that a different portion of the signal is suppressed for each successive subperiod, in the manner shown in FIG. 1 by subperiods T2 and T2'. Thus, during suppression subperiod T2, the amplitude of signal S is suppressed, and the corresponding integration subquantity TB shown in FIG. 1 is excluded from processing.

Figure 2:
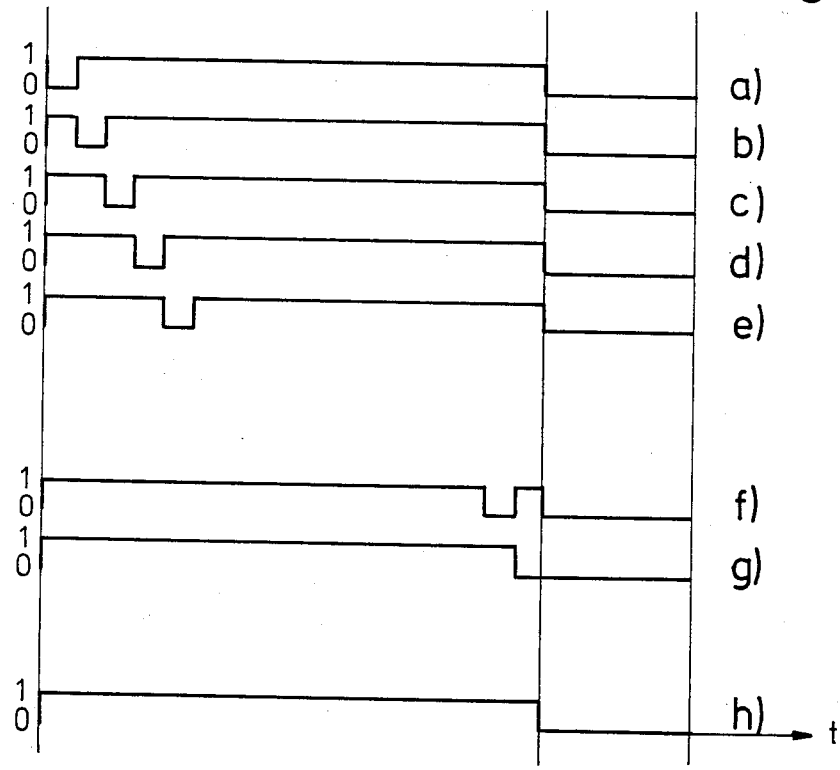
FIG. 2 shows a timing diagram of the on/off switching conditions of a switch for producing the signal suppression subperiods and resulting signal transmission periods.

The succeeding back-scattering signals S', etc., are also integrated. For these succeeding signals, besides suppressing the signal during time interval T3, the signal is also suppressed during associated suppression subperiods T2', etc., so that the integration subquantities denoted by TB', etc., are excluded from processing. FIG. 2 illustrates the type of switching arrangement that may be employed to successively shift the position of the suppression subperiod to the right, with respect to the beginning of the periodic signal, for successive repetitions of the periodic signal. In FIG. 2, a "0" level indicates a switch position for which the signal amplitude is not transmitted, i.e., is suppressed. A "1" level indicates a switch position for which the signal is transmitted for processing. Hence, in FIG. 2(a), the signal is suppressed during time T2, and transmitted during time T4, which latter time period is equal to base period T1 minus the suppression subperiod T2. In FIG. 2(b), the signal is transmitted during times T5' and T4', and is suppressed during time T2'. Again, the transmission time, T5'+T4', is equal to base period T1 minus suppression subperiod T2'. FIGS. 2(c)–2(f) show the suppression subperiod being successively shifted to the right. In FIG. 2(g), the suppression subperiod has been successively shifted far enough to the right so that the entire base period T1 has been covered by the plurality of suppression subperiods T2, T2', etc. Each of the plurality of processed signals, obtained from successively shifting the suppression subperiod in this manner, is associated with the signal suppression subperiod from which the respective signal was obtained. Thus, in accordance with the inventive method, a number of back-scattering signals S, S', S'', etc., are processed until the suppression subperiod has been shifted over the whole base period T1.

In addition, the amplitude of the back-scattering signal is processed without suppressing any portion thereof in the base period, so as to provide a signal which is representative of an overall processed value. A switching arrangement for providing this latter processing is shown in FIG. 2(h). The periodic signal is transmitted for processing during the entire time interval T1, and is excluded from processing during time interval T3. The method of the present invention further comprises subtracting each subperiod-associated processed signal from the overall signal, and arranging the resulting plurality of difference signals in the same sequence as their associated suppression subperiods so as to produce an output signal which has the same general waveform as the original periodic signal.

One of the advantages obtained with the use of the present invention is that, for determining the reduced-noise signal amplitude for a given portion of the signal, the overall signal which occurs in the base period is utilized. The significance of this feature is that the integration value or average value of this overall signal fluctuates much less than the corresponding value for a particular portion of the signal, determined by, for example, averaging several separate measurements of that portion of the signal amplitude. Thus, each portion of the overall signal need been taken into account only once in producing an overall processed signal freed from noise. This fact considerably shortens the number of signal repetitions required to improve the signal-to-noise ratio by a predetermined factor, as compared with conventional methods of noise reduction.

The signal suppression subperiods may be chosen so that they all have the same duration, or so that their durations are nonuniform. In the latter case, the individual durations of the suppression subperiods may be advantageously chosen so as to concentrate the distribution of the subperiods about one or more predetermined portions of the base time period. By doing so, a particular portion of the periodic signal may be focused on and processed using higher local resolution than for the remainder of the signal.

Furthermore, the various signals resulting from the processing of the present invention may be stored in either analogue or digital storage devices. The overall signal and the subperiod-associated signals, the difference signals, or both may be stored so that they are available for further processing.

In another embodiment of the invention, the signal freed from noise is provided with a predetermined time delay with respect to the periodic signal, either for further processing or for use by other equipment. The capability of the present invention of providing the reduced noise signal with a time delay allows the output signal to be expanded in time, and thereby results in the ability to further process the signal at a slower speed. Thus, noisy signals which have very high repetition frequency (short period and signal duration, respectively) can be processed by the present invention and then presented at a lower frequency, so that, instead of requiring a rapid and expensive real time oscilloscope or sampling oscilloscope, for example, for viewing the signal, the reduced noise signal may be viewed on, for example, a simple 10 MHz oscilloscope.

Figure 3:
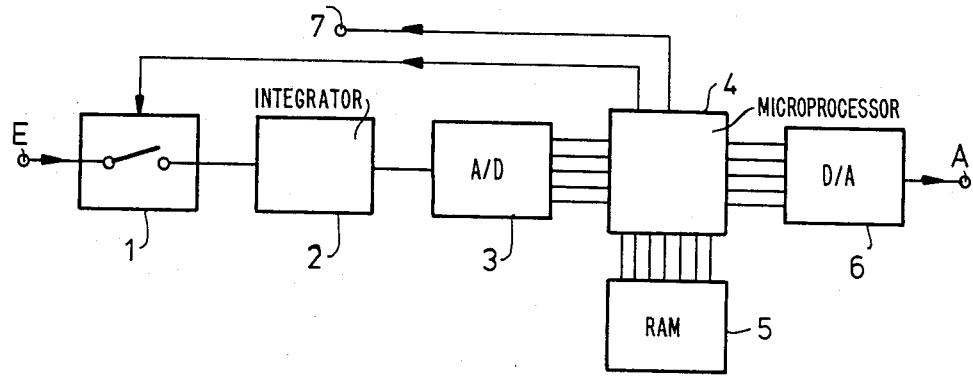
FIG. 3 shows a block diagram of a circuit arrangement according to the invention, utilizing a microprocessor.

FIG. 3 shows a circuit arrangement for performing the integration signal processing described above. The periodic signal is applied to the circuit at the point denoted in FIG. 3 by input E, and the reduced noise signal is provided by the circuit at the point denoted by output A. In order to suppress the signal amplitude during consecutive suppression subperiods T2, T2', etc., there is arranged in front of the integration circuit 2 in FIG. 3 an electrically controllable switch 1 which is connected to the circuit input E. Switch 1 is controlled so as to provide the switching conditions shown in FIG. 2. The switch 1 in FIG. 3 is consequently opened during the time intervals T2 and T3, shown in FIG. 2(a), while it is closed in the time interval T4. Similarly, switch 1 is opened during time intervals T2', T2", etc., shown in FIGS. 2(b)–2(g), and is closed during the associated transmission times T4'+T5', T4"+T5", etc. Thus, signal S is integrated only during the transmission periods T4, T4'+T5', etc. The signal amplitude during suppression subperiods T2, T2', etc. is excluded from the integration.

The integration values supplied by the integrator 2 in FIG. 3, as well as the overall integration value obtained when switch 1 is controlled as shown in FIG. 2(h), are digitized in an analogue-to-digital converter 3 the input of which is connected to the output of integrater 2. A succeeding microprocessor system 4 with associated RAM storage block 5 is connected to the output of analogue-to-digital converter 3. Microprocessor 4 performs the functions of storage of the integration and/or difference signals and recovery of a signal freed from noise from these values. For this purpose, the integration values associated with the suppression subperiods T2, T2', etc., are each subtracted from the overall integration value, in accordance with the positions of the associated suppression subperiods with respect to the beginning of the periodic signal. The resulting difference values are arranged in the same sequence as their associated suppression subperiods. The output signal freed from noise is then supplied to a digital-to-analogue converter 6 to provide an analogue signal at the circuit output A, which signal may, if desired, be further processed. The microprocessor system 4 also controls the analogue switch 1 so as to provide the switching arrangement shown in FIG. 2. Microprocessor 4 may further control triggering of a signal release system, such as, for example, a laser (not shown), via terminal 7.

Due to the processing control provided by the analogue switch, the function of suppressing the signal amplitude during the plurality of suppression subperiods described hereinabove can be effected in a comparatively simple manner. For this purpose, the analogue switch is opened only for a short time at the desired instant, the time of opening corresponding to the time duration of the associated suppression subperiod. The processing circuit itself requires a relatively small number of storage locations as compared with known circuits for performing this kind of noise reduction. For the present invention, only a predetermined number of subperiod-associated integration values or, alternatively, average values, as well as an overall integration value or overall average value, respectively, need be stored. Or, instead of storing these values, the subperiod-associated values may be first subtracted from the overall value, and the resulting difference values can be stored. The circuit can therefor be constructed in a comparatively simple manner and at low cost. Of course it is also possible to form an overall processed value simultaneously with the formation of each subperiod-associated processed value, so that the subtraction of the subperiod-associated value from the overall processed value can be effected immediately. In this case, the circuit requires an even smaller number of storage locations.

Figure 4:
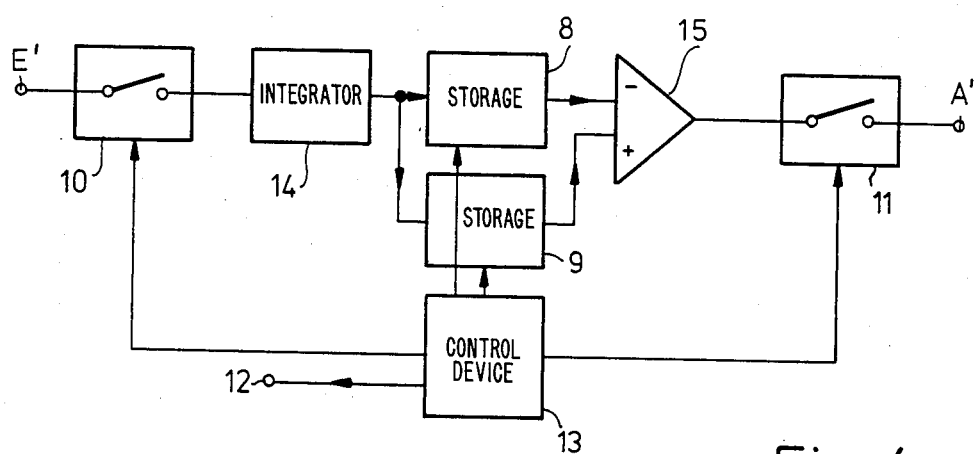
FIG. 4 shows a block diagram of a circuit arrangement according to the invention, utilizing analogue storages.

In the alternative embodiment illustrated in FIG. 4, the signal processing is performed using analogue devices. FIG. 4 shows a circuit arrangement comprising analogue storages 8 and 9, which, like the analogue switches 10 and 11 and the associated signal producing system, are controlled via the connection 12 by a control device 13. The switch 10 is connected to circuit input E', for suppressing or transmitting the periodic signal amplitude to integrator 14 in accordance with the switching arrangement shown in FIG. 2. The switch 11, the function of which is described hereinbelow, is connected to circuit output A'.

In operation, after, as already stated in connection with FIGS. 1 to 3, the subperiod-associated integration values produced by the integrator 14 have been successively stored in the analogue storage 8, the control device 13 ensures that the signal representing the overal integration value is formed and transferred to the storage 9. Storages 8 and 9 and subtraction member 15 are controlled by control device 13 so that the subperiod-associated integration values successively leave the storage 8 and are each subtracted, at the appropriate point in time with respect to the beginning of the periodic signal, from the overall integration value in subtraction member 15. Of course, the overall integration value may also be produced before producing the subperiod-associated integration values, instead of visa versa.

The switch 11 is operated by control device 13 so that irrelevant or inaccurate signals due to, for example, an earlier storage read cycle or an accidental storage of information in the analogue storage chain do not occur at the output A' of the overall circuit arrangement. The switch 11 releases the signal from subtraction member 15 to output point A' only after all subperiod-associated integration values are stored in storage 8, the overall integration value is stored in storage 9, and the signal freed from noise is composed again in subtraction member 15.

The signal processing of the present invention may also be performed without intermediate storage of the various signals described above. The circuit arrangement shown in FIG. 5 has two analogue switches 16 and 17, which are connected to circuit inputs E" and E"', respectively, and which, like the signal producing system, are controlled via a connection 18 by a control device 19. The outputs of switches 16 and 17 are connected to the inputs of integration members 20 and 21, respectively, and the outputs of integration members 20 and 21 are, in turn, each connected to the respective inputs of a subtraction member 22. The periodic signal for which the signal-to-noise ratio is to be improved is applied to both of circuit inputs E" and E"'. In the manner described hereinabove in relation to FIGS. 3 and 4, the subperiod-associated integration values are obtained by driving the switch 16 in the manner shown in FIG. 2 and integrating the signal amplitude in the integration member 20 during the corresponding transmission periods. Using the switch 17 and the integration member 21, an overall integration value is produced each time a subperiod-associated integration value is produced, by driving switch 17 in the manner shown in FIG. 2(h). Each subperiod-associated integration value is subtracted from the corresponding overall integration value in the subtraction member 22. With a sufficiently rapid shift of the signal suppression subperiod over the desired portion T1 of the periodic signal, it is possible to provide a real time representation of the reduced-noise back-scattering signal at the circuit output A", which signal can be viewed, for example, on a monitor or an oscilloscope.

Figure 5:
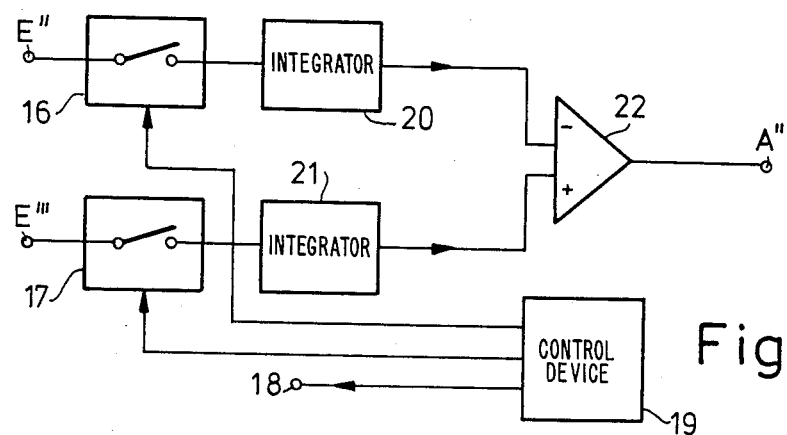
FIG. 5 shows a block diagram of a circuit arrangement according to the invention, without utilizing storage elements.

The circuit arrangements shown in FIGS. 3 to 5 may also be constructed so that, instead of using integration to form the subperiod-associated values and an overall processed value, the respective values are formed by an averaging process. Moreover, the method and the circuit arrangements described above may be applied not only to back-scattering signals in light wave guides, but also to generally every kind of noisy periodical signal.

The advantages of the method and circuit arrangements of the present invention reside in the provision of a very effective noise suppression technique, due to the fact that the overall signal is utilized for integration and for averaging, and in the comparatively low cost of construction, due to the fact that conventional analogue elements and inexpensive slow digital switching members can be used. Furthermore, the invention can be used for processing a wide variety of signals. By using a microprocessor system as a control device, an adaptation to arbitrary measuring tasks and problematics is readily possible via software variations.

What is claimed is:

1. A method of increasing the signal-to-noise ratio of a portion of a periodical electrical signal, said method comprising:

integrating the amplitude of said signal during a base time period corresponding to the portion of said periodical signal for which the signal-to-noise ratio is to be increased, so as to provide a first signal representative of an overall processed value;

dividing said time period into a plurality of consecutive signal suppression subperiods and, for each such subperiod, integrating the amplitude of the periodical signal during a signal transmission period which is equal to said base time period less said subperiod, so as to provide a plurality of integrated second signals, each associated with one suppression subperiod;

subtracting each subperiod-associated second signal from said first signal so as to provide a plurality of difference signals, each associated with a signal suppression subperiod; and arranging said difference signals in the same sequence as their associated suppression subperiods so as to produce an output signal having the same general waveform as the periodical signal and an improved signal-to-noise ratio.

2. The method of claim 1 wherein said steps of processing the amplitude of said signal during said base time period and during each said signal transmission period, respectively, comprise integrating said signal amplitude during each of said respective time periods.

3. The method of claim 1 wherein said steps of processing the amplitude of said signal during said base time period and during each said signal transmission period, respectively, comprise determining an average value for said signal amplitude for each of said respective time periods.

4. The method of claim 1 wherein said signal suppression subperiods have uniform durations.

5. The method of claim 1 wherein said suppression subperiods have non-uniform durations, with the individual durations of said suppression subperiods being preselected so as to concentrate the distribution of said suppression subperiods about one or more predetermined portions of said base time period.

6. The method of claim 1 further comprising storing said first signal and said second signals so that said respective signals are available for subtracting.

7. The method of claim 1 further comprising storing said difference signals so that said signals are available for arranging in a sequence.

8. The method of claim 1 further comprising providing said output signal with a predetermined time delay with respect to said periodical signal.

9. A circuit arrangement for increasing the signal-to-noise ratio of a portion of a periodical electrical signal, said circuit arrangement comprising:

at least one electrically controllable analogue switch, each said switch having an input for receiving said periodical signal and an output at which said signal is presented when said switch is in a closed position, each said switch being controllable so that a signal applied to the input thereof is selectably transmitted to or suppressed from the output of said switch;

at least one integration circuit for integrating the signals transmitted to the output of each said analogue switch, each said integration circuit being electrically connected to the output of one of said switches;

means for controlling said analogue switches and said integration circuits so as to provide a signal suppression subperiod and a signal transmission period for each of a plurality of repetitions of said periodical signal, the sum of said suppression subperiod and said transmission period being equal to the time interval containing the portion of said signal for which the signal-to-noise ratio is to be improved, said suppression subperiods being disposed with respect to the beginning of said periodical signal so that a different portion of said signal is suppressed for each said repetition thereof, said signal being transmitted to the switch output and integrated by the associated integration circuit during each said transmission period so as to form a plurality of subperiod-associated integration values, and so that an overall integration value is formed by integrating said periodical signal during at least one repetition thereof for a time period equal to the sum of said suppression subperiod and said transmission period;

means for successively subtracting each of said subperiod-associated integration values from said overall integration value, so as to form a plurality of difference values; and means for arranging said difference values in the same sequence as their associated suppression subperiods, so as to produce an output signal having the same general waveform as said periodical signal.

10. The circuit arrangement of claim 9 wherein said control means, said subtraction means, and said arranging means comprise an analogue-to-digital converter electrically connected to said integration means and a microprocessor electrically connected to said analogue-to-digital converter for producing digital representation of said output signal.

11. The circuit arrangement of claim 10 further comprising a digital-to-analogue converter electrically connected to said microprocessor for converting a digital representation of said output signal to an analogue signal.

12. The circuit arrangement of claim 9 further comprising means for storing said overall integration value and said subperiod-associated integration values, said storage means being connected to said at least one integration circuit and to said subtraction means so that all of said subperiod-associated integration values may be formed and stored before said difference values are formed.

13. The circuit arrangement of claim 9 further comprising means for storing said difference values so that they are available for arranging in the sequence of their associated suppression subperiods.

14. Apparatus for increasing the signal-to-noise ratio of a portion of a periodic electrical signal, said apparatus comprising:

means for integrating the amplitude of said signal during a base time period corresponding to the portion of said periodic signal for which the signal-to-noise ratio is to be increased, so as to provide a first signal representative of an overall processed value;

means for dividing said time period into a plurality of consecutive signal suppression subperiods and, for each said subperiod, integrating the amplitude of the periodic signal during a signal transmission period which is equal to said base time period less said subperiod, so as to provide a plurality of integrated second signals, each associated with one suppression subperiod;

means for subtracting each subperiod-associated second signal from said first signal so as to provide a plurality of difference signals, each associated with a signal suppression subperiod; and means for arranging said difference signals in the same sequence as their associated suppression subperiods so as to produce an output signal having the same general waveform as the periodic signal and an improved signal-to-noise ratio.

15. The apparatus of claim 14 wherein said means for integrating the amplitude of said signal during said base time period and said means for integrating the amplitude of said signal during said signal transmission periods each comprises means for determining an average value for said signal amplitude during said respective time periods.

16. The apparatus of claim 14 further comprising means for storing said first signal and said plurality of second signals so that said respective signals are available for further processing.

17. The apparatus of claim 14 further comprising means for storing said difference signals so that said signals are available for further processing.

18. The apparatus of claim 14 further comprising means for providing said output signal with a predetermined time delay with respect to said periodical signal.

* * * * *